United States Patent
Iijima

[11] Patent Number: 5,966,275
[45] Date of Patent: Oct. 12, 1999

[54] GMR MAGNETIC SENSOR HAVING AN IMPROVED SENSITIVITY OF MAGNETIC DETECTION

[75] Inventor: Makoto Iijima, Kawasaki, Japan

[73] Assignee: Fujitsu Limited, Kawasaki, Japan

[21] Appl. No.: 09/023,687

[22] Filed: Feb. 13, 1998

[30] Foreign Application Priority Data

Sep. 18, 1997 [JP] Japan ................................. 9-253661

[51] Int. Cl.⁶ ............................. G11B 5/39; H01L 43/00; G01R 33/02
[52] U.S. Cl. ........................ 360/113; 324/252; 338/32 R
[58] Field of Search ............................ 360/113; 324/252; 338/32 R

[56] References Cited

U.S. PATENT DOCUMENTS 5,452,163  9/1995  Coffey .................................... 360/113

FOREIGN PATENT DOCUMENTS 09050614  2/1997  Japan .

Primary Examiner—A. J. Heinz
Attorney, Agent, or Firm—Greer, Burns & Crain, Ltd

[57] ABSTRACT

A GMR magnetic sensor includes a lower electrode, a first non-magnetic metal layer formed on the lower electrode and including ferromagnetic regions, a second non-magnetic metal layer on the first non-magnetic metal layer, a third non-magnetic metal layer on the second non-magnetic metal layer and including ferromagnetic regions, and an upper electrode formed on the third non-magnetic metal layer, wherein a tunneling insulation film is disposed further between the first non-magnetic metal layer and the third non-magnetic metal layer.

10 Claims, 9 Drawing Sheets

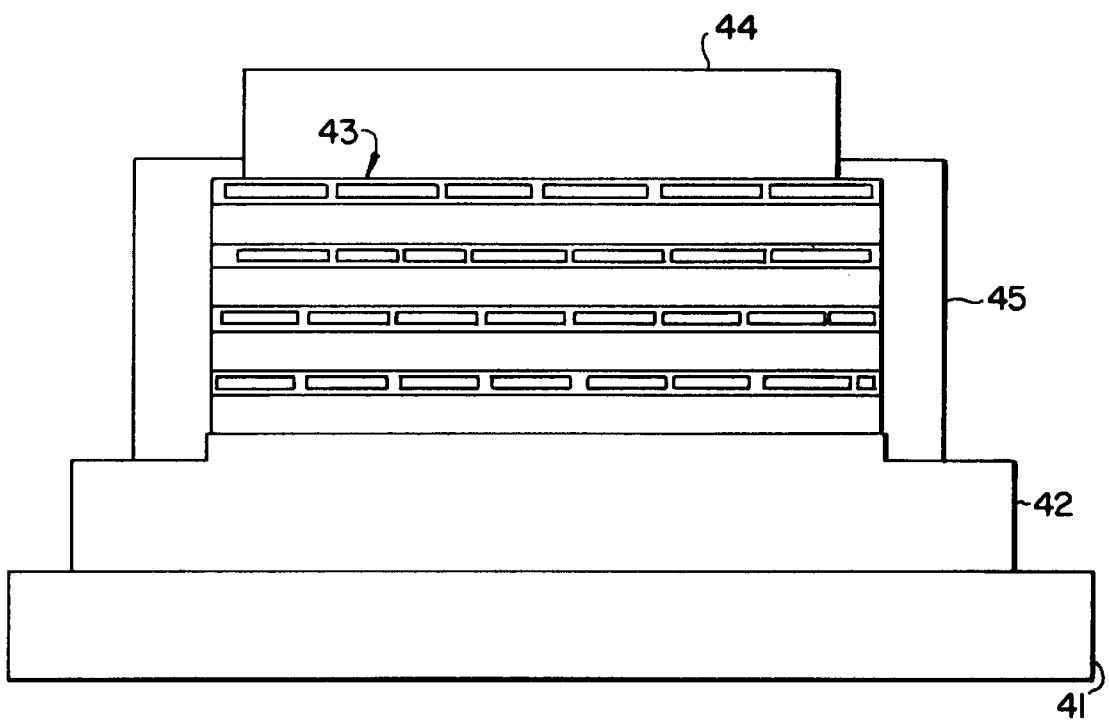

GMR MAGNETIC SENSOR HAVING AN IMPROVED SENSITIVITY OF MAGNETIC DETECTION

BACKGROUND OF THE INVENTION

The present invention generally relates to magnetic heads and more particularly to a high-sensitivity magnetic head that uses so-called GMR (giant magneto-resistive) effect.

Magnetic heads are used extensively from audio-visual apparatuses such as a tape recorder or video recorder to information processing apparatuses such as a computer. In an information processing apparatus, in particular, there is a persistent demand for recording a large amount of information signals in relation to processing of image data or audio data. In relation to this, there is a need of high-speed magnetic storage device having a very large storage capacity and hence a very large recording density. Such a large capacity magnetic storage device requires a magnetic head that is capable of performing writing and reading of information with a correspondingly high recording density.

The resolution of a magnetic head, which is a maximum recording density that the magnetic head can perform, is primarily determined by a gap width of the magnetic head and the distance from a recording medium to the gap. In an induction magnetic head in which a coil is wound around a magnetic core, a recording density of about 65 Mbits/inch$^2$ is achieved. However, this recording density is substantially insufficient in view of the recording density of 20 Gbits/inch$^2$ or more, which is expected to be required in future magnetic storage devices that use a very small recording dot.

In order to achieve the foregoing recording density of 20 Gbits/inch$^2$ or more, it is necessary to provide a very high-sensitivity magnetic head that is capable of detecting a very feeble magnetic signal at a very high speed. Such a high-speed detection of feeble magnetic signals is not possible by an induction magnetic head that is based upon the principle of electromagnetic induction, in view of required resolution, sensitivity and response.

As a high-sensitivity magnetic head that is capable of detecting such very feeble magnetic signals formed by very tiny recording dots, there is proposed a magnetic head that is equipped with a magneto-resistive magnetic sensor. See for example, P. Ciureanu and Gavrila, Studies in Electrical and Electronic Engineering 39, "Magnetic Heads for Digital Recording," Chapter 7, Elsevier Publication, 1990.

FIG. 1 shows a magnetic head 10 that includes a so-called GMR (giant magneto-resistive) sensor in a cross-sectional view, wherein a GMR sensor is a magneto-resistive magnetic sensor most suitable for detecting extremely feeble magnetic signals. Further, FIGS. 2A and 2B show the construction of a GMR sensor used for the magnetic head 10.

Referring to FIG. 1, the magnetic head 10 is formed on a ceramic substrate 11 of $Al_2O_3$—TiC and includes a lower magnetic shield 12 formed on the substrate 11 and an upper magnetic shield 14 that is formed on the lower magnetic shield 12 with a non-magnetic insulation film 13 interposed therebetween. The upper and lower magnetic shields 12 and 14 form a read gap 15 at a front end part of the magnetic head 10, and the gap 15 includes a GMR magnetic sensor 16 therein.

On the upper magnetic shield 14, there is provided a magnetic pole 18 with a non-magnetic insulation film 17 interposed therebetween, and a write gap 19 is formed between the magnetic pole 18 and the upper magnetic shield 14 at the front end part of the magnetic head 10. It should be noted that a write coil 20 is disposed in the insulation film 17.

FIGS. 2A and 2B show the GMR magnetic sensor 16 of FIG. 1 respectively in a state in which there is no external magnetic field and in a state in which an external magnetic field H is applied.

Referring to FIGS. 2A and 2B, the GMR magnetic sensor 16 includes a non-magnetic main body 16A of a conductive non-magnetic material such as Cu or Ag and a plurality of generally flat ferromagnetic regions 16B formed in the main body 16A with a diameter of several ten nanometers and a thickness of 2–4 nm. The ferromagnetic regions 16B are separated from each other with an optimum distance for an exchange interaction. As a result of the exchange interaction, there appears a magneto-static coupling between the adjacent ferromagnetic regions 16B, and there appears an anti-parallel relationship in the direction of magnetization in the ferromagnetic regions 16B as indicated in FIG. 2A as a result of the magneto-static coupling, when there is no external magnetic field applied to the magnetic sensor 16.

When an electron current is injected in the state of FIG. 2A from an electrode A provided on the top surface of the main body 16A to the interior of the main body 16A, those electrons in the electron current and having an upward spin state experience a scattering by a ferromagnetic region 16B having a first direction of magnetization. On the other hand, those electrons in the electron flow and having a downward spin state experience also a scattering by another ferromagnetic region 16B having a second, opposite direction of magnetization. Thereby, the number of electrons reaching an electrode B also provided on the top surface of the main body 16A is decreased, and the magnetic sensor 16 exhibits a high-resistance.

When an external magnetic field H is applied to the GMR sensor 16 as indicated in FIG. 2B, on the other hand, the direction of magnetization is aligned in one direction for all the ferromagnetic regions 16B as indicated in FIG. 2B, and the magneto-static coupling between the adjacent ferromagnetic regions 16B is invalidated. In such a state, those electrons in the electron current injected from the electrode A and having one of the upward or downward spin state successfully reach the electrode B after passing through the main body 16A, although the electrons having the other spin state are scattered similarly to the case of FIG. 2A. Thus, the magnetic sensor 16 decreases the resistance thereof in response to the application of the external magnetic field H.

In such a GMR magnetic sensor 16, on the other hand, there arises a problem, when an electron current is caused to flow through the main body 16A by applying a voltage across the electrodes A and B on the main body 16A, that a part of the electrons in the electron current may travel along a short-circuit path $P_2$ at the surface of the main body 16A rather than along a nominal path $P_1$ that penetrates deeply into the interior of the main body 16A. See FIG. 3. When such a bypassing of the electron current occurs along the current path $P_2$, the change of resistance of the GMR sensor 16 that is detected between the electrodes A and B, is masked by the electron current flowing along the current path $P_2$. As a result of such a masking, the sensitivity of magnetic detection is deteriorated inevitably.

The foregoing problem of bypass current path $P_2$ may be eliminated by providing another electrode C at the bottom of the main body 16A as indicted in FIG. 3 and detecting the resistance between the electrodes A and C. However, such an approach is unsuccessful in view of the small thickness of the main body 16A, which is at best about 50 nm. Because of the extremely small thickness of the main body 16A, the resistance across the electrodes A and C becomes substantially zero. Thereby, no reliable detection of resistance drop is possible.

SUMMARY OF THE INVENTION

Accordingly, it is a general object of the present invention to provide a novel and useful GMR magnetic head wherein the foregoing problems are eliminated.

Another and more specific object of the present invention is to provide a magnetic head including a GMR magnetic sensor in which a clear and reliable observation of magnetoresistance change is possible.

Another object of the present invention is to provide a GMR magnetic sensor, comprising:

a first electrode;

a first conductive non-magnetic layer provided on said first electrode;

a plurality of first ferromagnetic regions formed in said first conductive non-magnetic layer with a mutual separation from each other;

a second conductive non-magnetic layer provided on said first conductive non-magnetic layer;

a third conductive non-magnetic layer provided on said second conductive non-magnetic layer;

a plurality of second ferromagnetic regions formed in said third conductive non-magnetic layer with a mutual separation from each other;

a second electrode provided on said third conductive non-magnetic layer;

said first conductive nonmagnetic layer and said third conductive nonmagnetic layer are separated from each other by a distance that causes an exchange interaction between a first ferromagnetic region and a second ferromagnetic region; and a tunneling insulation film is disposed between said first conductive non-magnetic layer and said third conductive non-magnetic layer.

Another object of the present invention is to provide a method of fabricating a GMR magnetic sensor, including: a first electrode; a first conductive non-magnetic layer provided on said first electrode; a plurality of first ferromagnetic regions formed in said first conductive non-magnetic layer with a mutual separation from each other; a second conductive non-magnetic layer provided on said first conductive non-magnetic layer; a third conductive non-magnetic layer provided on said second conductive non-magnetic layer; a plurality of second ferromagnetic regions formed in said third conductive non-magnetic layer with a mutual separation from each other; a second electrode provided on said third conductive non-magnetic layer; said first conductive nonmagnetic layer and said third conductive nonmagnetic layer are separated from each other by a distance that causes an exchange interaction between a first ferromagnetic region and a second ferromagnetic region; and a tunneling insulation film is disposed between said first conductive non-magnetic layer and said third conductive non-magnetic layer, said method comprising the steps of:

forming said first conductive non-magnetic layer and said first ferromagnetic regions by: forming a first metal film containing a metal element constituting said first conductive non-magnetic layer and a metal element constituting said first ferromagnetic regions; and annealing said first metal film at a temperature set such that said first ferromagnetic regions and said first conductive non-magnetic layer separate from each other in said first metal film;

forming said third conductive non-magnetic layer and said second ferromagnetic regions by: forming a second metal film containing a metal element constituting said third conductive non-magnetic layer and a metal element constituting said second ferromagnetic regions; and annealing said second metal film at a temperature set such that said second ferromagnetic regions and said third conductive non-magnetic layer separate from each other in said second metal film; and forming said tunneling insulation film by: forming said second conductive non-magnetic layer; and processing a surface of said conductive non-magnetic layer.

Another object of the present invention is to provide a magnetic head, comprising:

a first magnetic shield;

a second magnetic shield formed on said first magnetic shield, with a read gap formed between said first magnetic shield and said second magnetic shield; and a GMR magnetic sensor disposed in said read gap, said GMR magnetic sensor comprising:

a first electrode;

a first conductive non-magnetic layer provided on said first electrode;

a plurality of first ferromagnetic regions formed in said first conductive non-magnetic layer with a mutual separation from each other;

a second conductive non-magnetic layer provided on said first conductive non-magnetic layer;

a third conductive non-magnetic layer provided on said second conductive non-magnetic layer;

a plurality of second ferromagnetic regions formed in said third conductive non-magnetic layer with a mutual separation from each other;

a second electrode provided on said third conductive non-magnetic layer;

said first conductive nonmagnetic layer and said third conductive nonmagnetic layer are separated from each other by a distance that causes an exchange interaction between a first ferromagnetic region and a second ferromagnetic region; and a tunneling insulation film is disposed between said first conductive non-magnetic layer and said third conductive non-magnetic layer.

According to the present invention, the resistance of the GMR magnetic sensor is increased in the absence of external magnetic field, due to the use of the tunneling insulation film between the first conductive non-magnetic layer and the third conductive first non-magnetic layer and hence between the first ferromagnetic regions and the second ferromagnetic regions. As a result of the increased resistance of the magnetic sensor, the detection of resistance drop, which is caused in response to the application of an external magnetic field, is achieved with high precision and improved reliability. As the first and second ferromagnetic regions are dispersed in the respective non-magnetic layers in the form of small islands, the direction of magnetization changes easily even when the external magnetic field applied to the GMR magnetic sensor has only a very small strength. Thus, the magnetic head that uses the GMR magnetic sensor of the present invention is suitable for detecting extremely feeble magnetic field as in the case of super high density magnetic recording.

Other objects and further features of the present invention will become apparent from the following detailed description when read in conjunction with the attached drawings.

BRIEF DESCRIPTION OF THE DRAWINGS

FIG. 5 is a diagram showing the construction of a GMR magnetic sensor according to an embodiment of the present invention;

DETAILED DESCRIPTION OF THE PREFERRED EMBODIMENTS

[Principle]

Figure 4A:
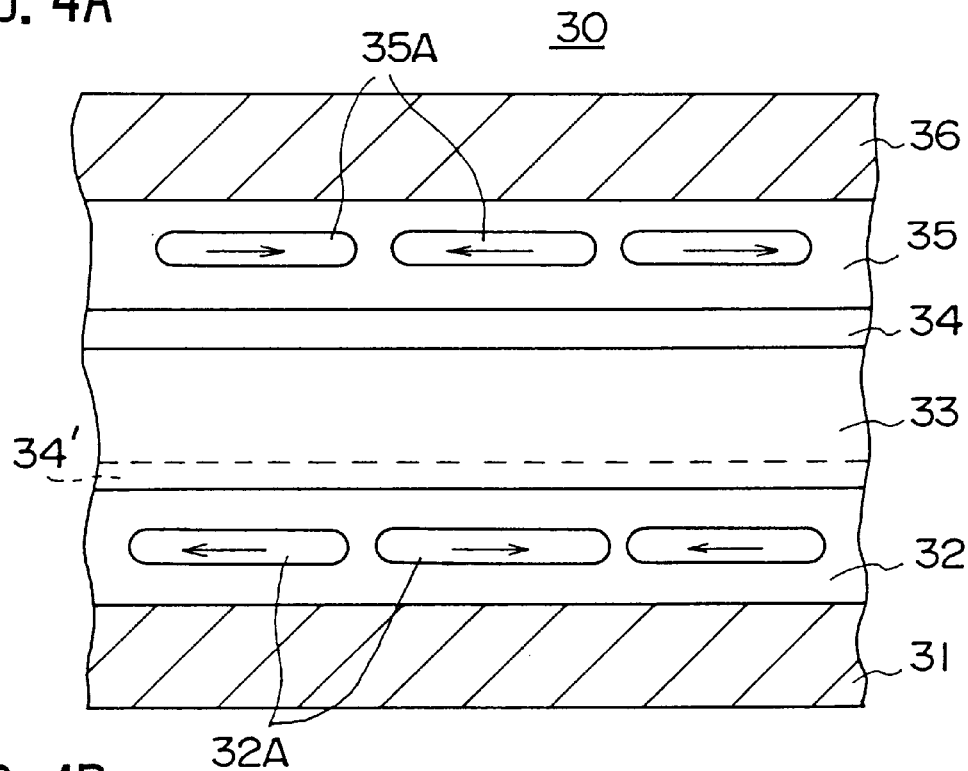
FIGS. 4A and 4B are diagrams explaining the principle of the present invention.

FIG. 4A shows the fundamental construction of a GMR magnetic sensor 30 of the present invention. Further, FIG. 4B shows the GMR magnetic sensor 30 in a state that an external magnetic field H is applied.

Referring to FIG. 4A, the GMR magnetic sensor 30 includes a first conductive non-magnetic layer 32 provided on a first electrode 31, a plurality of first ferromagnetic regions 32A formed in the first conductive non-magnetic layer 32 with a mutual separation from each other; a second conductive non-magnetic layer 33 provided on the first conductive non-magnetic layer 32; a third conductive non-magnetic layer 35 provided on the second conductive non-magnetic layer 33; a plurality of second ferromagnetic regions 35A formed in the third conductive non-magnetic layer 35 with a mutual separation from each other; a second electrode 36 provided on the third conductive non-magnetic layer 35; and a tunneling insulation film 34 disposed between the first conductive non-magnetic layer 32 and the third conductive non-magnetic layer 35.

Figure 3:
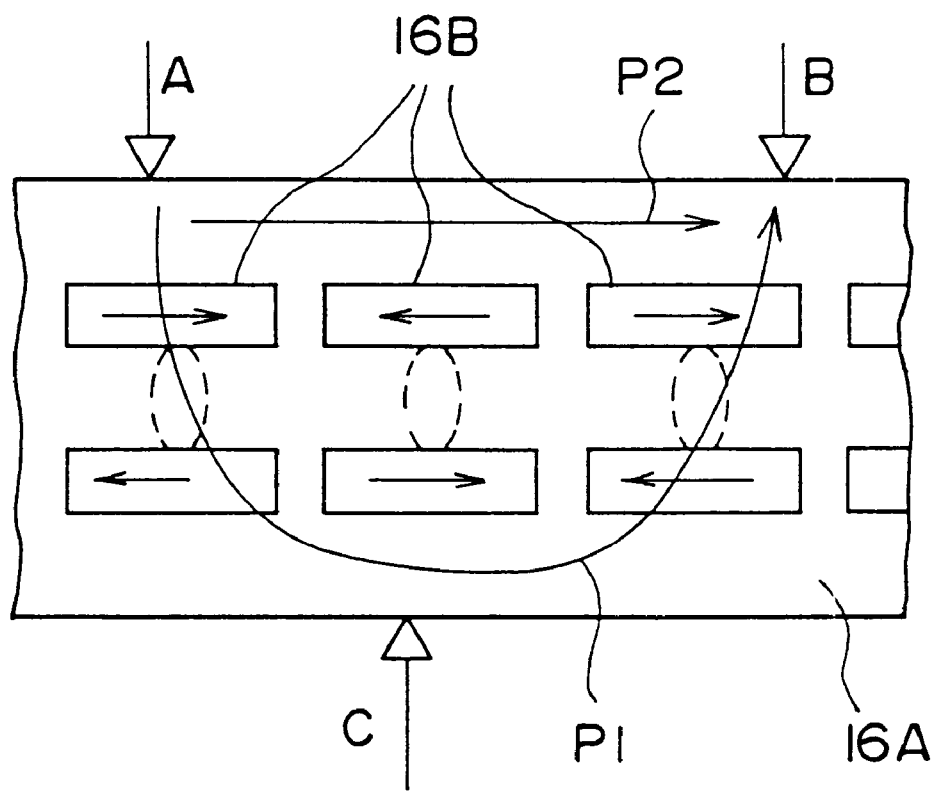
FIG. 3 is a diagram explaining the problem of the conventional GMR magnetic sensor.

According to the present invention, the problem of too small resistance of the magnetic sensor 30 for detecting a resistance drop thereof, is successfully eliminated even in the case an electron current is caused to flow vertically to the layered structure forming the magnetic sensor, by disposing the tunneling insulation film 34 between the first ferromagnetic region 32A and the second ferromagnetic region 35A. As the electron current is caused to flow vertically to the foregoing layered structure, the problem of the electron current flowing at the surface part of the layered structure as explained with reference to FIG. 3 does not occur in the GMR magnetic sensor of the present invention.

Figure 4B:
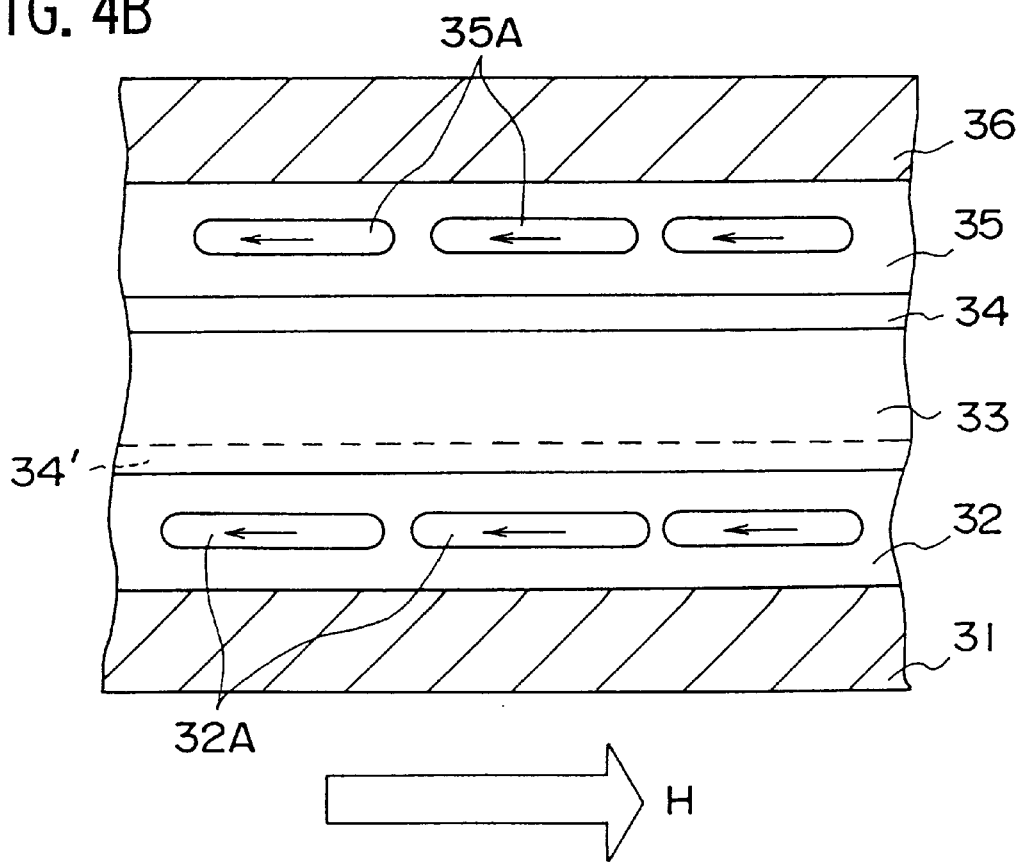

By forming the tunneling insulation film 34 between the first ferromagnetic regions 32A and the second ferromagnetic regions 35A, the tunneling current, caused to flow as a result of the ferromagnetic tunneling effect, increases substantially when the direction of magnetization is aligned in the ferromagnetic regions 32A and 35A as a result of application of the external magnetic field H as indicated in FIG. 4B. Thereby, the inversion of magnetization is substantially facilitated by forming the foregoing first and second ferromagnetic regions 32A and 35A in the form of mutually isolated regions in the respective non-magnetic layers 32 and 35.

In the example of FIGS. 4A and 4B, the tunneling insulation film 34 is formed between the foregoing second non-magnetic layer 33 and the third non-magnetic layer 35. However, the present invention is not limited to such a particular construction. For example, the tunneling insulation film 34 may be provided between the first non-magnetic layer 32 and the second non-magnetic layer 33. Alternatively, another tunneling insulation film 34' may be formed inside the non-magnetic layer 33 as indicated in FIGS. 4A and 4B.

FIG. 5 shows the construction of a GMR magnetic sensor 40 according to an embodiment of the present invention.

Referring to FIG. 5, the GMR magnetic sensor 40 is constructed on a Si substrate 41 and includes a lower electrode 42 of Cu formed on the substrate 41 with a thickness of about 200 nm and a magnetic layered structure 43 formed on the lower electrode 42. On the magnetic layered structure 43, an upper electrode 44 of Cu is formed with a thickness of about 200 nm, and an insulation film 45 is provided so as to cover the side walls of the magnetic layered structure 43. Further, there is provided a layer of $Al_2O_3$ (not shown) between the Si substrate 41 and the lower electrode 42.

Figure 6:
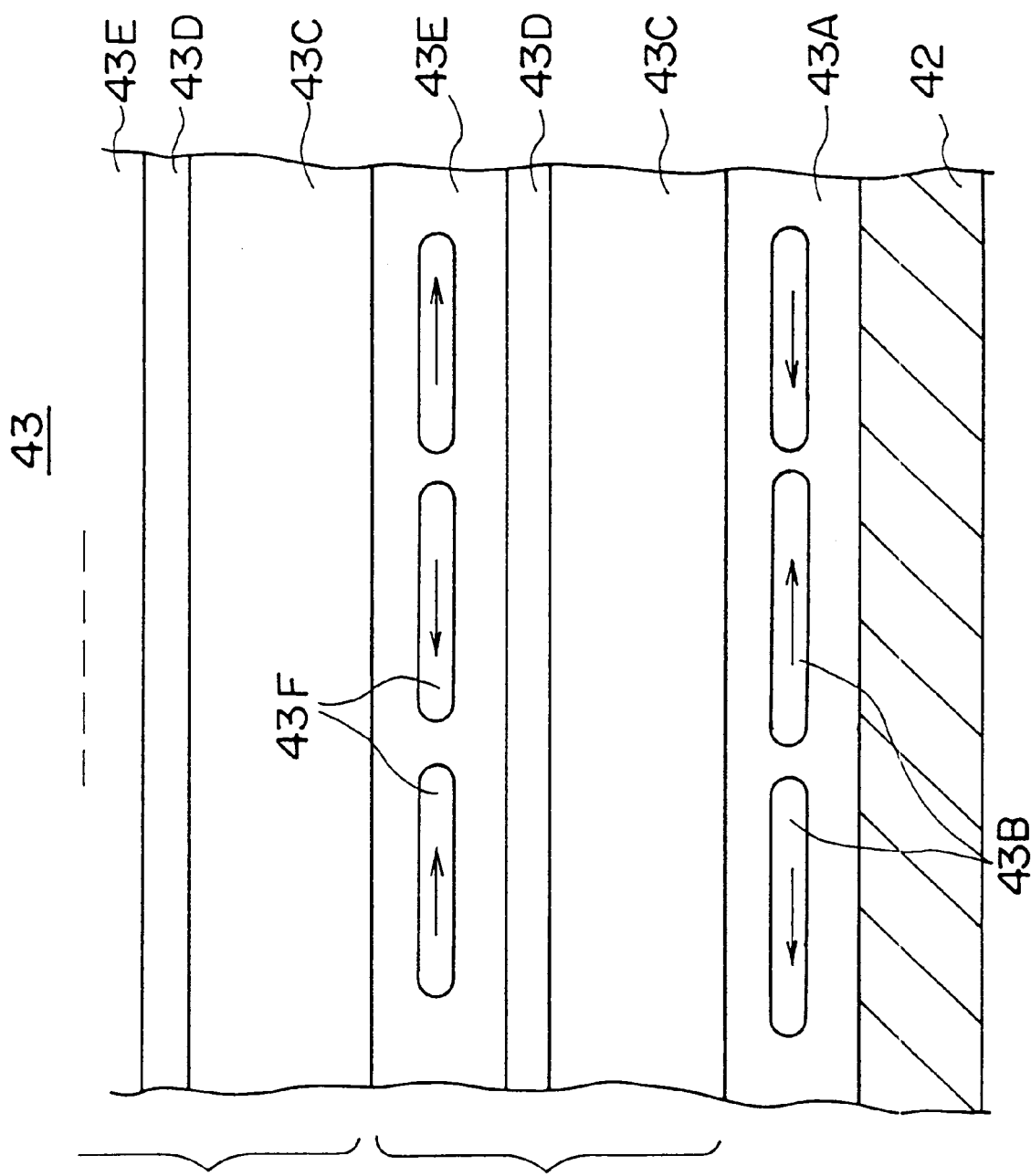
FIG. 6 is a diagram showing a part of the GMR magnetic sensor of FIG. 5 in an enlarged scale.

FIG. 6 shows a part of the magnetic layered structure 43 of FIG. 5 in detail.

Referring to FIG. 6, a non-magnetic layer 43A of Ag is formed on the lower electrode 42 with a thickness of about 1.5 nm, and a number of ferromagnetic regions 43B of a Co—Fe alloy are formed in the foregoing Ag layer 43A in the form of a flat disk-like shape having a thickness of typically 2–4 nm and a diameter of several ten nanometers. The non-magnetic layer 43A is covered by another non-magnetic layer 43C of Cu having a thickness of about 4 nm, and a thin tunneling insulation film 43D of $Al_2O_3$ is formed on the non-magnetic layer 43C with a thickness of about 0.5 nm.

Further, a non-magnetic layer 43E having a construction identical to that of the layer 43A is formed on the tunneling insulation film 43D, and the layers 43C–43E are repeated on the layer 43E a plurality of times. It should be noted that the layer 43E includes therein ferromagnetic regions 43F.

In the layer 43A or 43E, it should be noted that the ferromagnetic regions 43B or 43F are magnetized in an anti-parallel relationship as a result of the exchange interaction when there is no external magnetic field applied to the magnetic sensor 40. Further, the anti-parallel relationship appears also between the magnetization of a ferromagnetic region 43B in the non-magnetic layer 43A and the magnetization of a corresponding ferromagnetic region 43F in the non-magnetic layer 43E, also as a result of the exchange interaction.

In such a construction, the direction of magnetization is aligned, when an external magnetic field is applied to the magnetic sensor 40, in a direction opposite to the direction of the external magnetic field for all the ferromagnetic regions 43B and the ferromagnetic regions 43F. As a result, the electric current flowing vertically through the tunneling insulation film 43D is increased substantially and the resistance of the magnetic sensor 40 is decreased.

In the GMR magnetic sensor 40 of FIG. 5 or 6, the tunneling insulation film 43D is formed repeatedly a plurality of times. Thereby, a high resistance is achieved in the state where there is no external magnetic field. Further, the magnetic sensor 40 is inherently immune to the problem of bypass or short-circuit current path explained with reference to FIG. 3. Thereby, the magnetic sensor 40 shows a very high sensitivity of magnetic detection.

Figure 7:
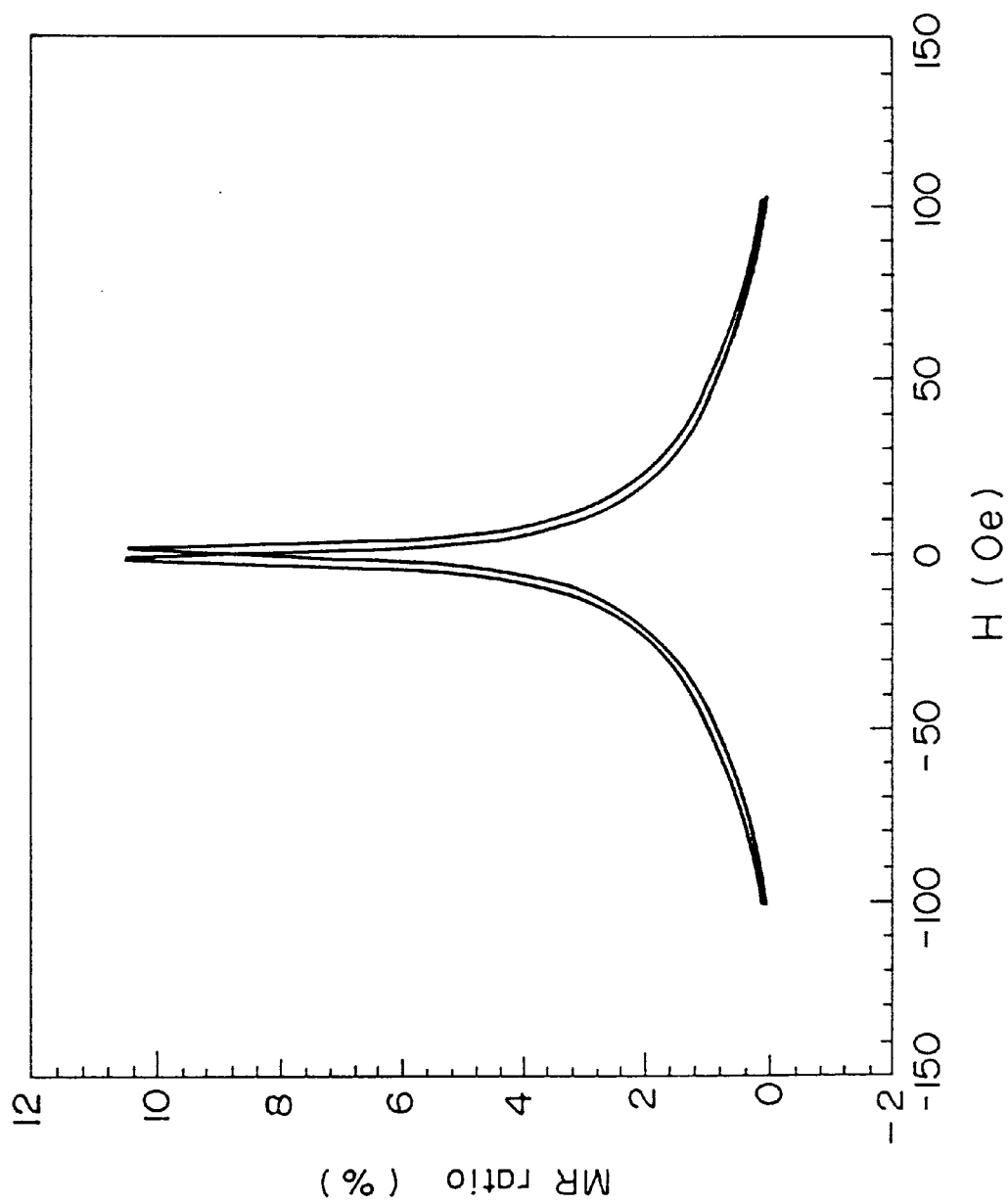
FIG. 7 is a diagram showing the magneto-resistance of the GMR magnetic sensor of FIG. 5.

FIG. 7 shows the resistance change of the magnetic sensor 40.

Referring to FIG. 7, the mutually isolated ferromagnetic regions 43B or 43F of the magnetic sensor 40 cause an inversion of magnetization easily, and there appears an alignment of magnetization in the ferromagnetic regions 43B and also in the ferromagnetic regions 43F when an external magnetic field of only about 50 Oe is applied to the magnetic sensor 40. In response to such an alignment of the magnetization of the ferromagnetic regions 43B and 43F, the resistance of the magnetic sensor 40 is decreased substantially. As can be seen from FIG. 7, the resistance of the magnetic sensor 40 takes a maximum value when the external magnetic field has a value of +8 Oe or –8 Oe. When the magnitude of the external magnetic field exceeds the foregoing value, the resistance of the magnetic sensor 40 is decreased rapidly. Thereby, the magnitude of resistance drop reaches as much as $0.5\Omega$.

Next, the fabrication process of the structure of FIG. 6 will be described with reference to FIGS. 8A and 8B.

Figure 8A:
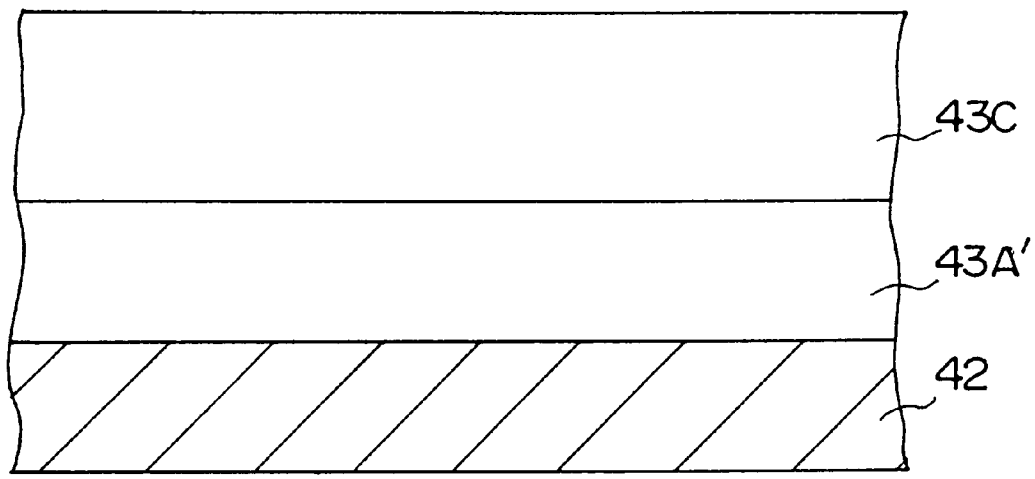
FIGS. 8A and 8B are diagrams showing the fabrication process of the magnetic sensor of FIG. 5.
Figure 8B:
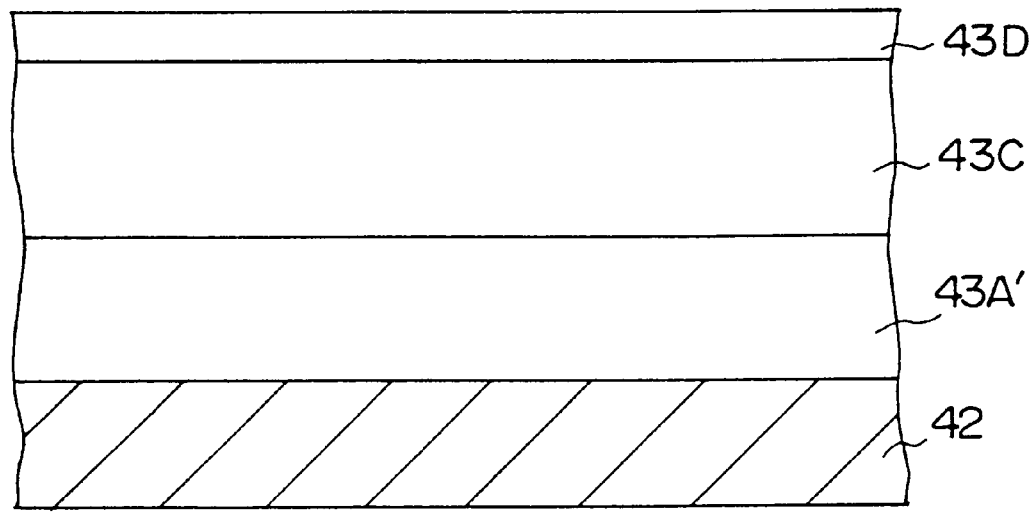

Referring to FIG. 8A, the lower electrode 42 is formed on a (100) surface of the Si substrate (not shown) by a sputtering of Cu with a thickness of about 200 nm. Next, a metal layer 43A' of the system Co—Fe—Ag is formed on the lower electrode 42 in correspondence to the layer 43A by a sputtering process with a thickness of about 1.5 nm. Further, the non-magnetic layer 43C of Cu is formed on the layer 43A' by a sputtering process with a thickness of about 4 nm. After the formation of the layer 43C, the $Al_2O_3$ film 43D is formed in the step of FIG. 8B on the layer 43C thus formed by a sputtering process with a thickness of about 0.5 nm.

The sputtering processes for forming the layers 43A'–43D are conducted in an Ar atmosphere under a pressure of $2\times10^{-5}$ Pa by setting the distance between the target and the substrate to 180 mm and the RF power to 0.7 W/cm$^2$. The sputtering processes are repeated five times, for example, to form the foregoing magnetic layered structure 43.

After formation of the magnetic layered structure 43, the upper electrode 44 is formed by a sputtering process of Cu with a thickness of about 200 nm, and the structure thus formed is subjected to a thermal annealing process conducted at a temperature of about 280° C. for about 1 hour. As a result of such a thermal annealing process, there occurs a separation of the ferromagnetic regions 43B and 43F of a Co—Fe alloy in the layer 43A', leaving behind the layer 43A or 43E of Ag, and the structure explained in FIG. 6 is obtained.

In the process of forming the structure of FIG. 6, it should be noted that the deposition of layers 43A', 43C and 43D is by no means limited to the sputtering process as explained above, but other deposition processes such as ion beam sputtering, molecular beam epitaxy or vacuum vapor deposition may also be used. Further, the tunneling insulation film 43D may be formed of oxidation, nitridation or boridation of a metal layer. For example, it is possible to form the non-magnetic layer 43 by Al and form the tunneling insulation film 43D by an oxidation, nitridation or boridation of the Al layer 43. Further, such an oxidation, nitridation or boridation process may be conducted in a plasma environment.

Figure 9:
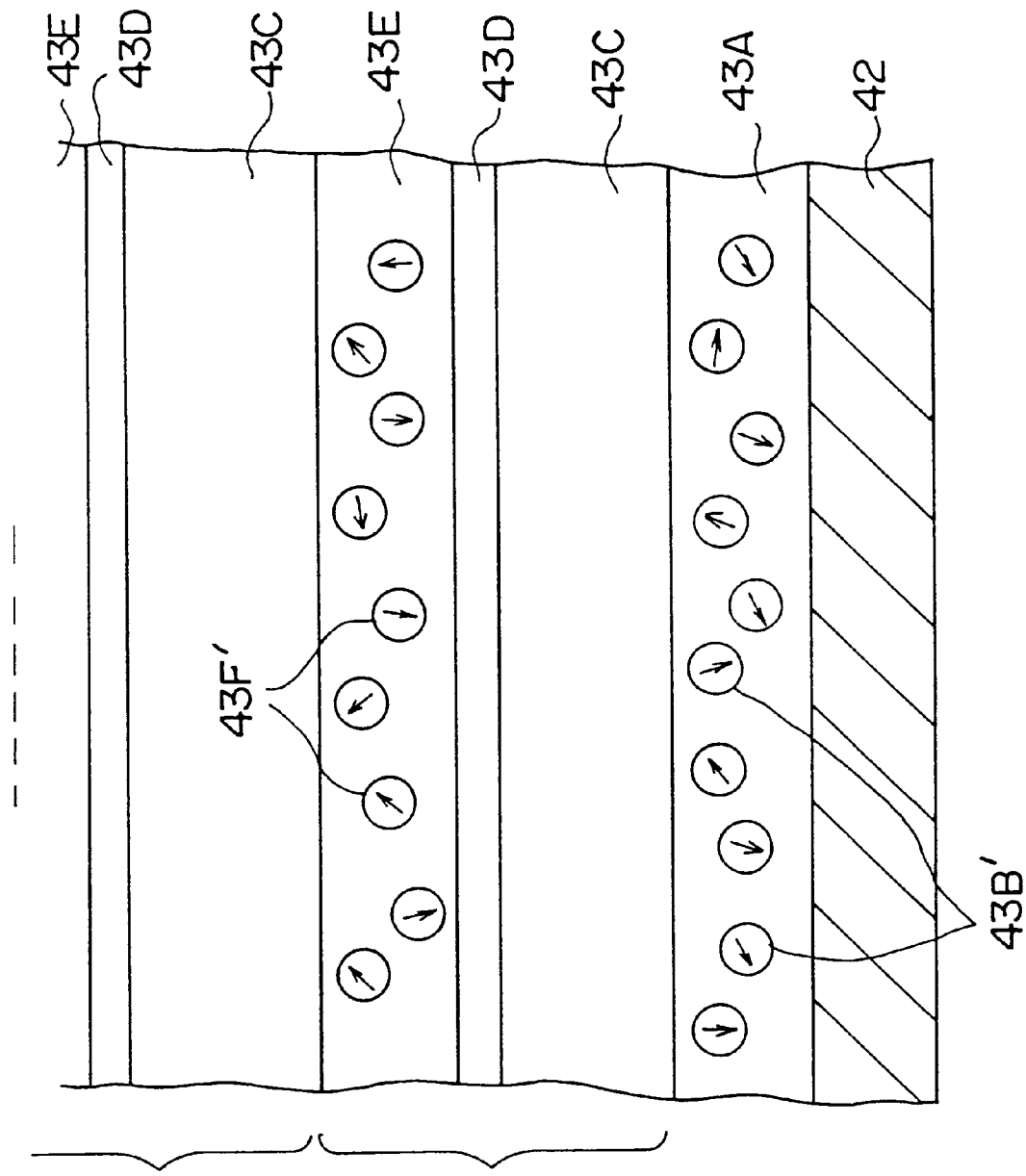
FIG. 9 is a diagram showing a modification of the GMR magnetic sensor of FIG. 5.

FIG. 9 shows a modification of the structure of FIG. 6, wherein those parts corresponding to the parts described previously are designated by the same reference numerals and the description thereof will be omitted.

Referring to FIG. 9, the present embodiment uses granular ferromagnetic regions 43B' or 43F' in the non-magnetic layer 43A or non-magnetic layer 43E, wherein the granular ferromagnetic regions 43B' or 43F' have a diameter of about 1–10 nm. As a result of the granular structure, the ferromagnetic regions 43B' or 43F' easily experience a thermal agitation, and it is difficult to cause an anti-parallel alignment in the magnetization of the ferromagnetic regions 43B' or 43F' by the magneto-static coupling. On the other hand, the magnetization of these minute ferromagnetic regions change easily by a very feeble external magnetic field.

In the embodiment of FIG. 9, too, it is possible to increase the resistance of the magnetic sensor by interposing the tunneling insulation film 43D and using the ferromagnetic tunneling effect between the ferromagnetic regions 43B' and the ferromagnetic regions 43F' via the tunneling insulation film 43D. The increased resistance of the magnetic sensor decreases easily and sharply when a very small external magnetic field is applied. It should be noted that the formation of such granular ferromagnetic regions is described in the Japanese Laid-Open Patent Publication 09-050614.

Figure 1:
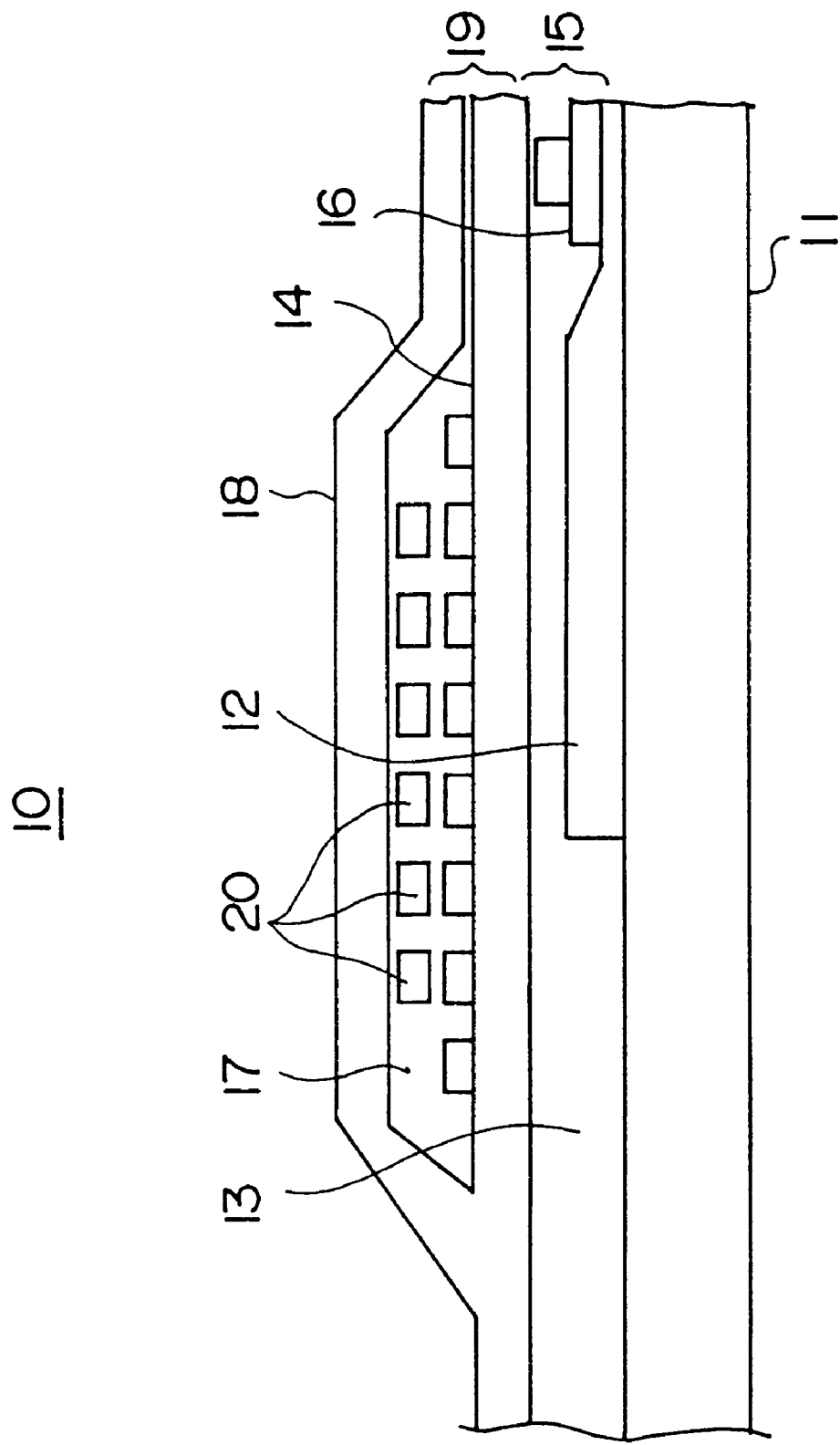
FIG. 1 is a diagram showing the construction of a conventional magnetic head using a GMR magnetic sensor.
Figure 2A:
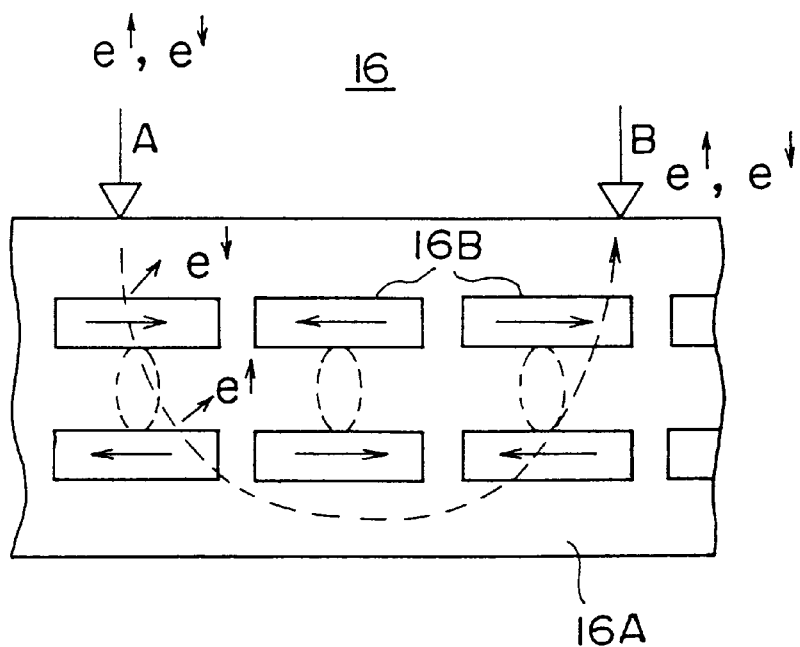
FIGS. 2A and 2B are diagrams showing the principle of a conventional GMR magnetic sensor.
Figure 2B:
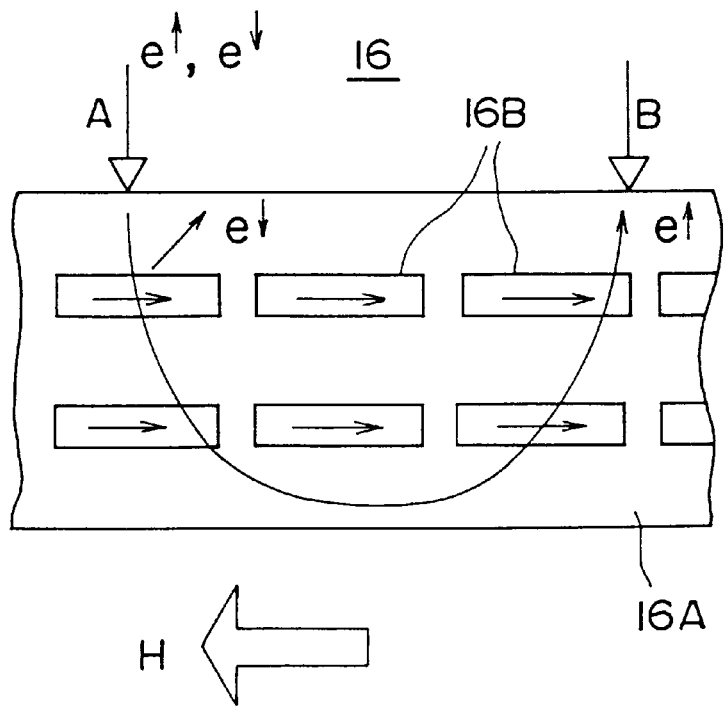

By using the GMR magnetic sensor of FIGS. 5 and 6 or the GMR magnetic sensor of FIG. 9 in the magnetic head of FIG. 1 in place of the conventional GMR magnetic head 16, a high-sensitivity magnetic sensor suitable for super-high density magnetic recording is obtained.

Further, the present invention is not limited to the embodiments described heretofore, but various variations and modifications may be made without departing from the scope of the invention.

What is claimed is:

1. A giant magneto-resistive magnetic sensor, comprising:
   a first electrode;
   a first conductive non-magnetic layer provided on said first electrode;
   a plurality of first ferromagnetic regions formed in said first conductive non-magnetic layer with a mutual separation from each other;
   a second conductive non-magnetic layer provided on said first conductive non-magnetic layer;
   a third conductive non-magnetic layer provided on said second conductive non-magnetic layer;
   a plurality of second ferromagnetic regions formed in said third conductive non-magnetic layer with a mutual separation from each other;
   a second electrode provided on said third conductive non-magnetic layer;
   said first conductive nonmagnetic layer and said third conductive nonmagnetic layer are separated from each other by a distance that causes an exchange interaction between a first ferromagnetic region and a second ferromagnetic region; and
   a tunneling insulation film is disposed between said first conductive non-magnetic layer and said third conductive non-magnetic layer.

2. A giant magneto-resistive magnetic sensor as claimed in claim 1, wherein said tunneling insulation film is provided between said second conductive non-magnetic layer and said third conductive non-magnetic layer.

3. A giant magneto-resistive magnetic sensor as claimed in claim 1, wherein said second conductive non-magnetic layer is formed of a non-magnetic metal, and wherein said tunneling insulation film is formed of an oxide of said non-magnetic metal.

4. A giant magneto-resistive magnetic sensor as claimed in claim 1, wherein said tunneling insulation film is disposed between said first conductive non-magnetic layer and said second non-magnetic layer.

5. A giant magneto-resistive magnetic sensor as claimed in claim 1, wherein said second conductive non-magnetic layer has a composition different from a composition of said first conductive non-magnetic layer, and wherein said third conductive non-magnetic layer has a composition different from said composition of said second conductive non-magnetic layer.

6. A giant magneto-resistive magnetic sensor as claimed in claim 1, wherein each of said first ferromagnetic regions and each of said second ferromagnetic regions have a thickness of about 2–4 nm and a diameter of several ten nanometers.

7. A giant magneto-resistive magnetic sensor as claimed in claim 1, wherein each of said first and third conductive non-magnetic layers has a thickness of about 0.1–3 nm, and wherein said tunneling insulation film has a thickness of about 0.1–0.5 nm.

8. A giant magneto-resistive magnetic sensor as claimed in claim 1, wherein each of said first and second ferromagnetic regions is formed of a metal selected from a group consisting of Co, Fe, Ni and an alloy thereof, and wherein each of said first through third conductive non-magnetic layers is formed of a metal selected from a group consisting of Ag, Cu, Au and an alloy thereof.

9. A giant magneto-resistive magnetic sensor as claimed in claim 1, wherein said tunneling insulation film is formed of any of oxide, nitride and boride.

10. A magnetic head, comprising:

a first magnetic shield;

a second magnetic shield formed on said first magnetic shield, with a read gap formed between said first magnetic shield and said second magnetic shield; and a GMR magnetic sensor disposed in said read gap, said GMR magnetic sensor comprising:

a first electrode;

a first conductive non-magnetic layer provided on said first electrode;

a plurality of first ferromagnetic regions formed in said first conductive non-magnetic layer with a mutual separation from each other;

a second conductive non-magnetic layer provided on said first conductive non-magnetic layer;

a third conductive non-magnetic layer provided on said second conductive non-magnetic layer;

a plurality of second ferromagnetic regions formed in said third conductive non-magnetic layer with a mutual separation from each other;

a second electrode provided on said third conductive non-magnetic layer;

said first conductive nonmagnetic layer and said third conductive nonmagnetic layer are separated from each other by a distance that causes an exchange interaction between a first ferromagnetic region and a second ferromagnetic region; and a tunneling insulation film is disposed between said first conductive non-magnetic layer and said third conductive non-magnetic layer.

* * * * *